United States Patent
Ahmed et al.

(10) Patent No.: US 12,014,983 B2
(45) Date of Patent: Jun. 18, 2024

(54) ASSEMBLIES HAVING CONDUCTIVE INTERCONNECTS WHICH ARE LATERALLY AND VERTICALLY OFFSET RELATIVE TO ONE ANOTHER AND METHODS OF FORMING ASSEMBLIES HAVING CONDUCTIVE INTERCONNECTS WHICH ARE LATERALLY AND VERTICALLY OFFSET RELATIVE TO ONE ANOTHER

(71) Applicant: Micron Technology, Inc., Boise, ID (US)

(72) Inventors: Raju Ahmed, Boise, ID (US); Radhakrishna Kotti, Boise, ID (US); David A. Kewley, Boise, ID (US); Dave Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/947,038

(22) Filed: Sep. 16, 2022

(65) Prior Publication Data
US 2023/0021072 A1    Jan. 19, 2023

Related U.S. Application Data

(63) Continuation of application No. 16/925,767, filed on Jul. 10, 2020, now Pat. No. 11,482,492.

(51) Int. Cl.
*H01L 23/528* (2006.01)
*H01L 23/522* (2006.01)
(Continued)

(52) U.S. Cl.
CPC ........ *H01L 23/528* (2013.01); *H01L 23/5226* (2013.01); *H10B 61/00* (2023.02); *H10B 63/84* (2023.02)

(58) Field of Classification Search
CPC ........ H01L 23/528; H10B 61/00; H10B 63/84
See application file for complete search history.

(56) References Cited

U.S. PATENT DOCUMENTS

| 8,885,422 B2 | 11/2014 | Ribeiro et al. |
| 10,573,362 B2 | 2/2020 | Dodge et al. |

(Continued)

FOREIGN PATENT DOCUMENTS

| TW | 201113986 | 4/2011 |
| TW | 201724358 | 7/2017 |

(Continued)

OTHER PUBLICATIONS

Mellor, "Thanks for the memory:XPoint put under the analyst microscope", available online at https://www.theregister.co.uk/2015/09/23/zeroing_in_on_xpoint_memory/, Sep. 23, 2015, 3 pages.

*Primary Examiner* — Shih Tsun A Chou
(74) *Attorney, Agent, or Firm* — Wells St. John P.S.

(57) ABSTRACT

Some embodiments include an integrated assembly having a base which includes first circuitry. Memory decks are over the base. Each of the memory decks has a sense/access line coupled with the first circuitry. The memory decks and base are vertically spaced from one another by gaps. The gaps alternate in a vertical direction between first gaps and second gaps. Overlapping conductive paths extend from the sense/access lines to the first circuitry. The conductive paths include first conductive interconnects within the first gaps and second conductive interconnects within the second gaps. The first and second conductive interconnects are laterally offset relative to one another.

9 Claims, 8 Drawing Sheets

(51) Int. Cl.
*H10B 61/00* (2023.01)
*H10B 63/00* (2023.01)

(56) References Cited

U.S. PATENT DOCUMENTS

| | | |
|---|---|---|
| 2012/0049148 A1 | 3/2012 | Fukano |
| 2017/0092576 A1 | 3/2017 | Shepard |
| 2020/0035916 A1 | 1/2020 | Trinh |
| 2021/0074767 A1* | 3/2021 | Lee .................. H10B 63/84 |

FOREIGN PATENT DOCUMENTS

| | | |
|---|---|---|
| TW | 201921631 | 6/2019 |
| TW | 110124910 | 4/2022 |

* cited by examiner

ASSEMBLIES HAVING CONDUCTIVE INTERCONNECTS WHICH ARE LATERALLY AND VERTICALLY OFFSET RELATIVE TO ONE ANOTHER AND METHODS OF FORMING ASSEMBLIES HAVING CONDUCTIVE INTERCONNECTS WHICH ARE LATERALLY AND VERTICALLY OFFSET RELATIVE TO ONE ANOTHER

RELATED PATENT DATA

This patent is a continuation of and claims priority to U.S. patent application Ser. No. 16/925,767, filed Jul. 10, 2020, the disclosures of which are incorporated herein by reference.

TECHNICAL FIELD

Integrated assemblies (e.g., integrated memory). Integrated assemblies having multiple levels (decks, tiers), and having conductive interconnects extending between the levels.

BACKGROUND

In some applications, it can be desired to couple circuitry from one level to another. FIGS. 1-4 illustrate an example prior art process for electrically coupling circuitry across levels.

Figure 1:
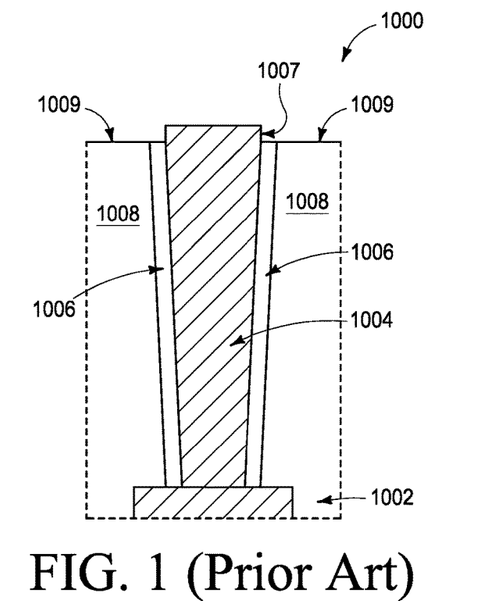
FIGS. 1 and 2 are diagrammatic cross-sectional side views of an integrated assembly at sequential process stages of a prior art process sequence.

FIG. 1 shows an assembly 1000 having a conductive structure 1002 at a first elevational level, and having a conductive interconnect 1004 extending upwardly from the structure 1002. In some applications, the structure 1002 may be coupled with logic circuitry (e.g., complementary metal-oxide-semiconductor (CMOS)).

In the shown embodiment, an insulative liner 1006 is along an outer edge of the conductive interconnect, and an insulative material 1008 is along the liner 1006 and over the structure 1002. The insulative material 1008 and the liner 1006 may comprise the same composition as one another, or may comprise different compositions relative to one another.

A planarized surface 1009 extends along the insulative material 1008 and the liner 1006. The conductive interconnect 1004 projects upwardly to above the planarized surface 1009. In some applications, it is desired for the planarized surface 1009 to extend across the conductive material of the interconnect 1004, as well as across the insulative material 1008 and the liner 1006. However, processing limitations may result in the upper surface of the conductive interconnect 1004 projecting above the planarized surface 1009. In the illustrated application, the interconnect 1004 has a projection (step) 1007 which extends above the planarized surface 1009.

Figure 2:
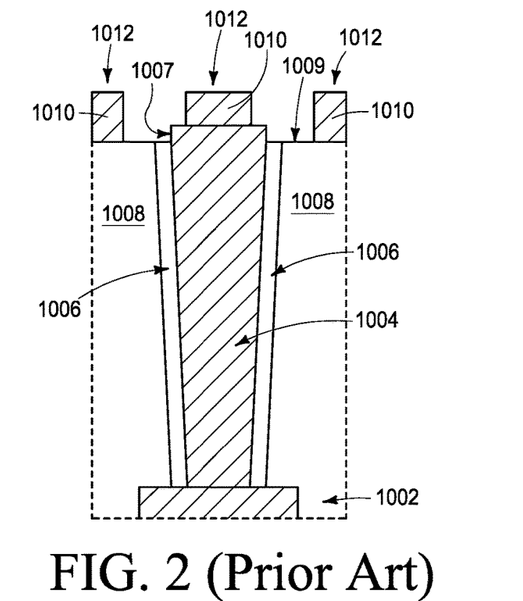

Referring to FIG. 2, conductive material 1010 is provided over the upper surface 1009 and the interconnect 1004, and is patterned into conductive structures 1012. The conductive structures 1012 may be lines extending into and out of the page relative to the cross-sectional view of FIG. 2. In some applications, the conductive structures 1012 may be sense/access lines (wordlines or bitlines).

Figure 3:
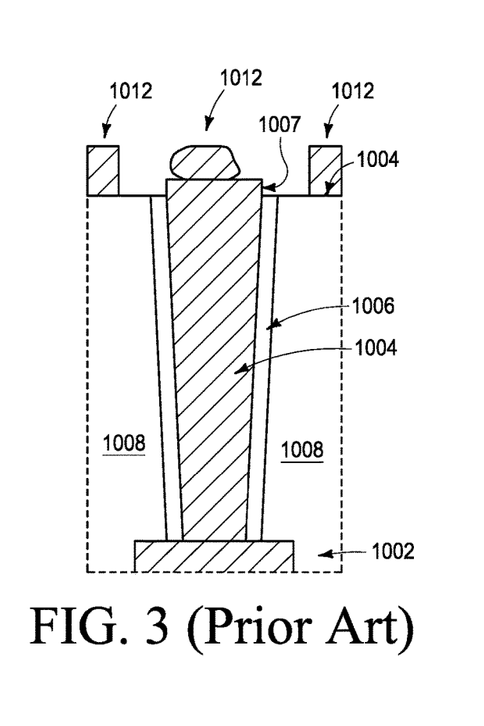
FIGS. 3 and 4 are diagrammatic cross-sectional side views of an integrated assembly at sequential process stages of a prior art process sequence.

The upward projection of the interconnect 1004 may problematically influence the patterning of the conductive structures 1012. For instance, FIG. 3 shows a problem which may result during such patterning, and shows the central structure 1012 having a different shape (a contorted shape) relative to the structures formed on the planarized surface 1009.

Figure 4:
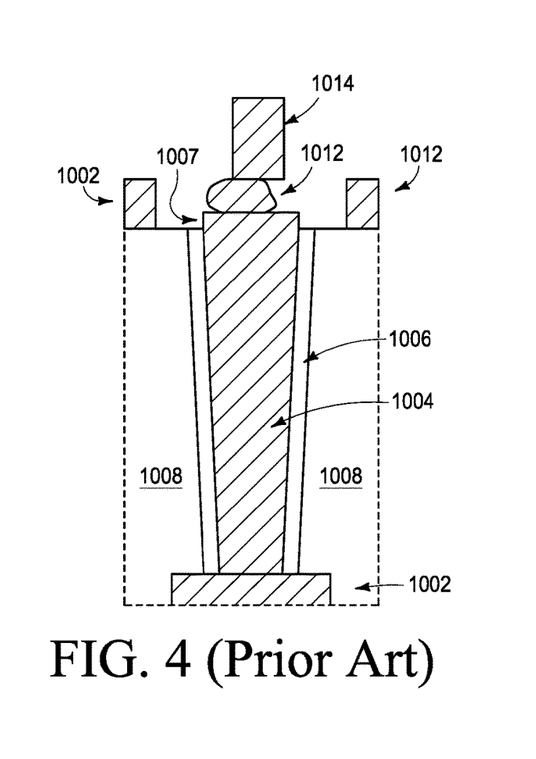

The contorted shape of the central structure 1012 may complicate further processing. For instance, FIG. 4 shows a conductive structure 1014 formed over the conductive structure 1012. The conductive structure 1014 is poorly supported by the structure 1012 due to the contorted shape of the structure 1012. Thus, the structure 1014 may shift from a desired location leading to problematic impairment of device performance, and even to device inoperability.

In some applications, the structure 1014 may be a conductive interconnect which is utilized for coupling sense/access lines from an upper level (upper deck) of memory to logic circuitry through the structure 1002, and the structure 1004 may be a conductive interconnect which is utilized for coupling sense/access lines (1012) from a lower level (lower deck) of memory to the logic circuitry through the structure 1002. The problematic coupling of the structure 1014 to the contorted structure 1012 may problematically impact the coupling of the sense/access lines from the upper level to the logic circuitry.

Figure 5:
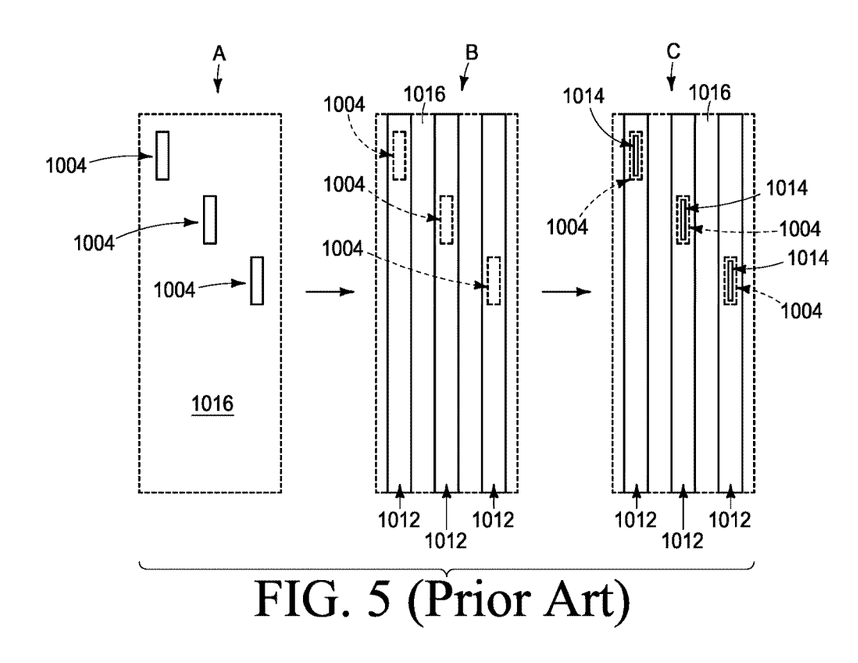
FIG. 5 shows diagrammatic top views of an integrated assembly at sequential process stages of a prior art process sequence.

FIG. 5 diagrammatically illustrates an example prior art arrangement for a series of the conductive interconnects 1004 at a process stage A. Specifically, the interconnects are in a staggered arrangement along a supporting base 1016.

A series of sense/access lines 1012 is formed over the interconnects 1004 at a process stage B. The interconnects 1004 are shown in dashed-line (phantom) view at the process stage B to indicate that they are under the sense/access lines 1012.

The second interconnects 1014 are formed on the sense/access lines 1012, and directly over the first interconnects 1004, at a process stage C.

Figure 6:
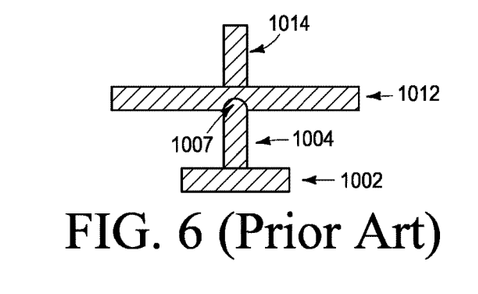
FIG. 6 is a diagrammatic cross-sectional side view of an integrated assembly of the prior art.

FIG. 6 shows a cross-sectional view along one of the sense/access lines 1012 of FIG. 5, and shows the conductive interconnect 1014 being formed directly over the conductive interconnect 1004. In the illustrated application, the conductive interconnect 1004 penetrates into the sense/access line 1012 due to the conductive interconnect 1004 having the problematic upward projection (step) 1007 described above with reference to FIG. 1.

Although the interconnect 1014 is shown to be aligned with the interconnect 1004, in practice the projection 1007 may alter the shape of the conductive line 1012 to render it difficult, if not impossible, to appropriately land the interconnect 1014 on the conductive line 1012. The interconnect 1014 may miss the line 1012 entirely (i.e., may be shifted in or out of the page relative to the cross-sectional view of FIG. 6), or may only catch an edge of the line 1012, as is diagrammatically illustrated in FIG. 4.

It is desired to develop assemblies which alleviate the problems associated with attempting to land the upper interconnects 1014 on the conductive structures 1012. Specifically, it is desired to avoid landing the upper interconnects 1014 on surfaces which may be shifted by the projecting regions 1007.

DETAILED DESCRIPTION OF THE ILLUSTRATED EMBODIMENTS

Some embodiments include multilevel (multitier, multideck) arrangements having vertically-extending interconnects within gaps between the various levels. The interconnects alternate between first interconnects and second interconnects in a vertical direction. The second interconnects are laterally offset relative to the first interconnects. In some embodiments, the first and second interconnects may be incorporated into conductive paths which electrically couple sense/access lines with logic circuitry (e.g., CMOS). Example embodiments are described with reference to FIGS. 7-14.

Figure 7:
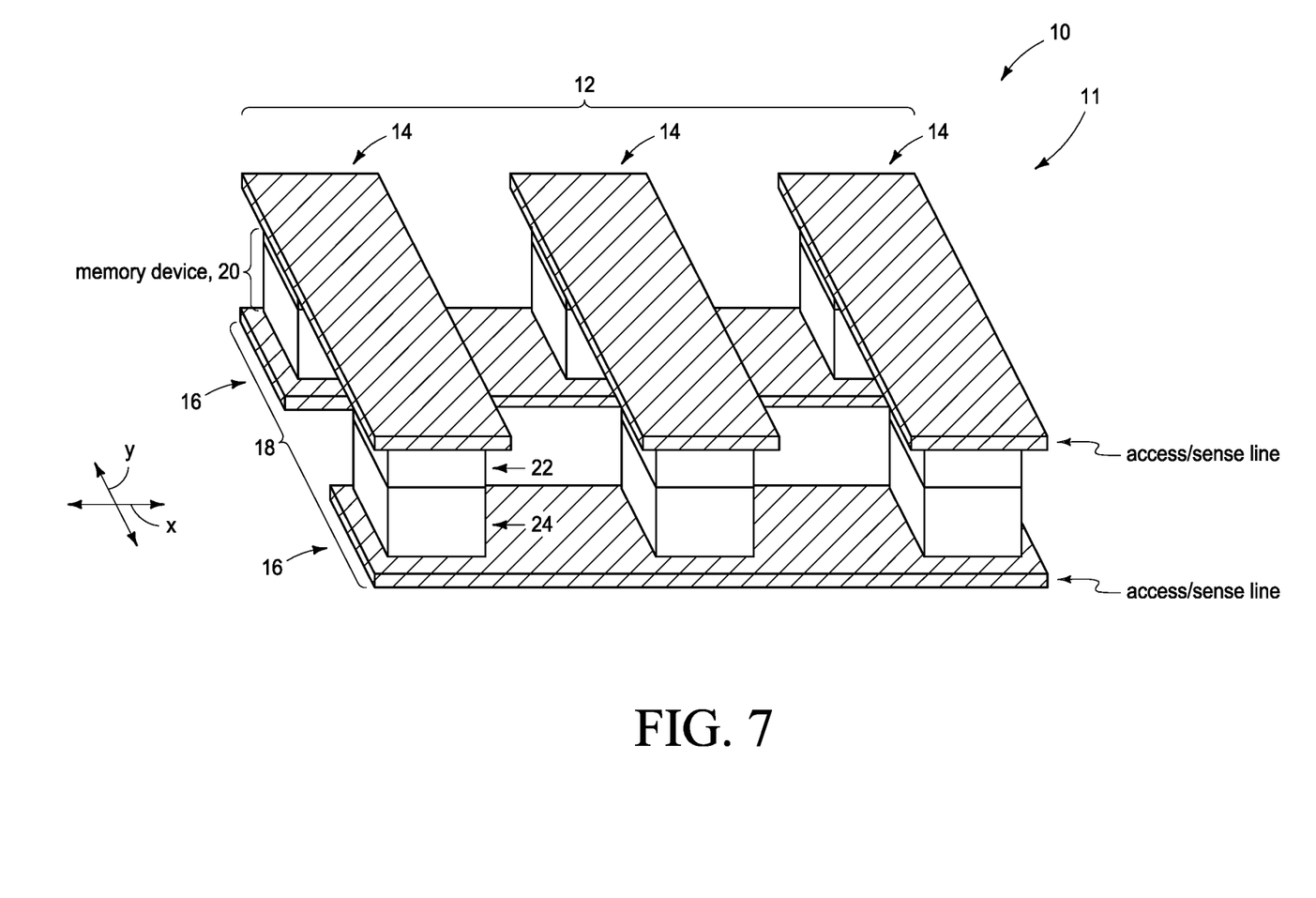
FIGS. 7 and 8 are diagrammatic three-dimensional views of example memory assemblies.

It is useful to describe example memory arrays before describing the interconnect arrangements of example embodiments. A region of an example memory array 10 is shown in FIG. 7. The array comprises memory devices 20. First sense/access lines 14 are over the memory devices, and second sense/access lines 16 are under the memory devices. The first sense/access lines 14 extend along an illustrated y-axis direction, and the second sense/access lines 16 extend along the illustrated x-axis direction. In some embodiments, the first sense/access lines 14 may be considered to extend along a first direction, and the second sense/access lines 16 may be considered to extend along a second direction which crosses the first direction. The second direction may be substantially orthogonal to the first direction (as shown), or not. The term "substantially orthogonal" means orthogonal to within reasonable tolerances of fabrication and measurement.

The term "sense/access line" (or alternatively, the term "access/sense line") is generic for wordlines (access lines) and bitlines (sense lines). In some embodiments, the conductive lines 14 may be wordlines while the conductive lines 16 are bitlines, and in other embodiments the conductive lines 16 may be the wordlines while the conductive lines 14 are the bitlines.

The conductive lines 14 and 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive lines 14 and 16 may or may not comprise a same composition as one another.

The conductive lines 14 may be considered to form a first set 12 of the sense/access lines, and the conductive lines 16 may be considered to form a second set 18 of the sense/access lines.

The memory devices 20 are at cross-points where the first sense/access lines 14 overlap the second sense/access lines 16. In some embodiments, the illustrated assembly of FIG. 7 may be considered to be an example of a three-dimensional cross-point memory configuration. Each of the memory devices 20 comprises a memory cell 22 over an access device (select device) 24.

The memory cells 22 may comprise any suitable configurations, and may comprise programmable material having two or more selectable resistive states to enable storing of information. Examples of such memory cells are resistive RAM (RRAM) cells, phase change RAM (PCRAM) cells (or, more generally, phase change memory (PCM) cells), and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs. Additional example memory includes ferroelectric memory, magnetic RAM (MRAM) and spin-torque RAM.

The access devices 24 may comprise any suitable configurations. For instance, the access devices may comprise diodes, ovonic threshold switches (OTSs), etc.

The memory array 10 may be considered to be configured as a memory deck 11.

Figure 8:
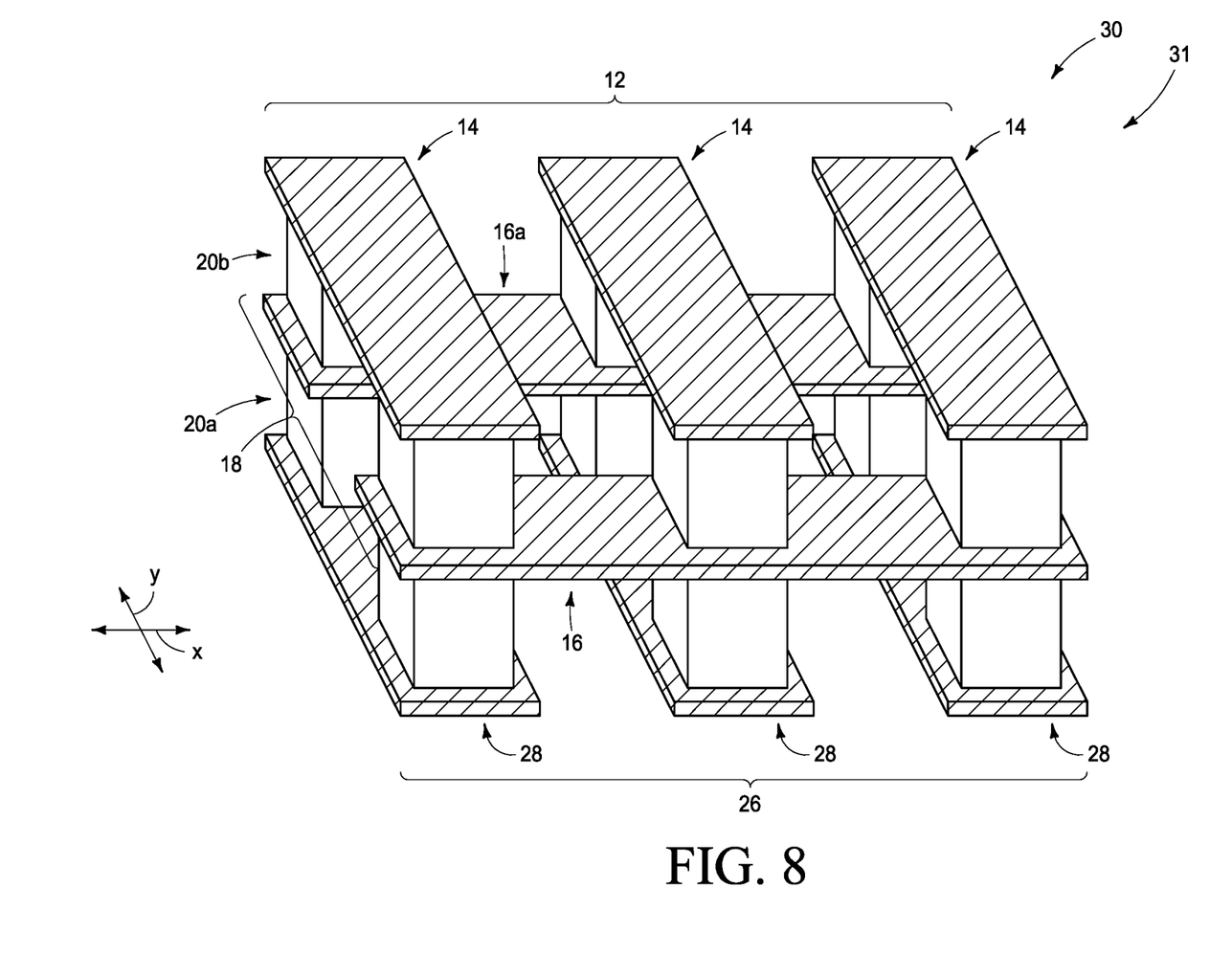

FIG. 8 shows another example memory array 30. The memory array 30 comprises three sets 12, 18 and 26 of the sense/access lines: with the first set 12 comprising the sense/access lines 14, the second set 18 comprising the sense/access lines 16, and the third set 26 comprising sense/access lines 28. The sense/access lines 16 may be considered to be first sense/access lines, and the sense/access lines 14 and 28 may be considered to be second sense/access lines. The first sense/access lines 16 may correspond to either bitlines or wordlines, and the second sense/access lines 14 and 28 may correspond to the other of bitlines and wordlines. In other words, in some embodiments the first sense/access lines 16 may be bitlines while the sense/access lines 14 and 28 are wordlines, or vice versa.

The set 18 of the first sense/access lines may be considered to be vertically sandwiched between the sets 12 and 26 of the second sense/access lines. The memory devices 20 between the sets 18 and 26 of sense/access lines may be referred to as a first set of memory devices (with an example memory device of the first set being labeled 20a), and the memory devices 20 between the sets 18 and 12 of the sense/access lines may be referred to as a second set of memory devices (with an example memory device of the second set being labeled 20b).

The memory devices 20a and 20b of FIG. 8 may be identical to the devices 20 of FIG. 7, and may each comprise an access device (i.e., the device 24 of FIG. 7) in combination with a memory cell (i.e., the memory cell 22 of FIG. 7). The structures 22 and 24 are not shown in FIG. 8 in order to simplify the drawing. In some embodiments, the illustrated assembly of FIG. 8 may be considered to be another example of a three-dimensional cross-point memory configuration.

The memory array 30 may be considered to be configured as a memory deck 31.

Each of the memory cells of FIGS. 7 and 8 is uniquely addressed by a pair of the sense/access lines. For instance, each of the memory devices 20 of FIG. 7 is uniquely addressed by one of the sense/access lines 14 in combination with one of the sense/access lines 16. Similarly, each of the memory devices 20 of FIG. 8 is uniquely addressed by one of the sense/access lines 16 in combination with one of the sense/access lines 14 or one of the sense/access lines 28. In some applications, the sense/access lines 16 may be considered to be shared sense/access lines in that they are shared between pairs of memory cells (and associated memory devices). For instance, one of the sense/access lines 16 of FIG. 8 is labeled as 16a, and such is shared between the memory devices labeled 20a and 20b.

Figure 9:
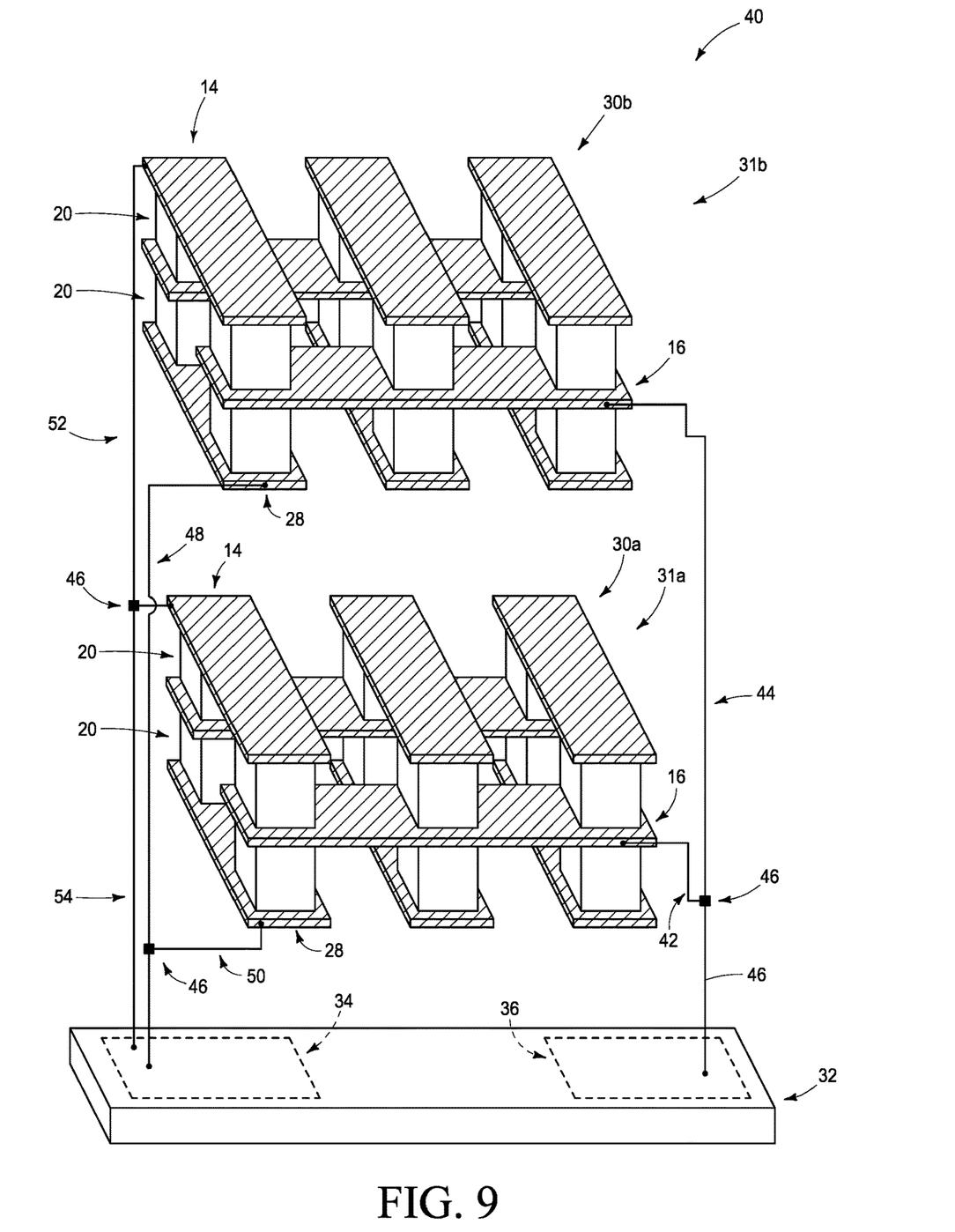
FIG. 9 is a diagrammatic three-dimensional view of an example multideck arrangement.

FIG. 9 shows an integrated assembly 40 comprising a base 32, and comprising a pair of the memory decks 31 over the base. The decks are labeled as 31a and 31b so that they may be distinguished from one another.

The base 32 comprises logic circuitry, with such logic circuitry being shown to be subdivided between two regions 34 and 36. The logic circuitry may comprise any suitable configuration(s), and in some embodiments may comprise CMOS. One of the regions 34 and 36 may comprise bitline decoder circuitry and/or sensing circuitry (e.g., sense amplifier circuitry), and the other may comprise wordline decoder circuitry and/or wordline driver circuitry.

The sense/access lines 16 of the upper and lower decks 31a and 31b are electrically coupled with the circuitry region 36 through interconnects 42 and 44, respectively; and through a shared interconnect 46. The sense/access line 16 of the upper deck 31b may be considered to have a conductive path to the region 36 which overlaps a conductive path from the sense/access line 16 of the lower deck 31a to the region 36, with the coupling of the conductive paths being diagrammatically illustrated with a box (junction) 46. Similarly, the sense/access lines 28 of the upper and lower decks 31a and 31b have conductive paths to the circuitry region 34 which include interconnects 48 and 50, and the sense/access lines 14 of the upper and lower decks have conductive paths to the circuitry region 34 which include interconnects 52 and 54. Boxes (junctions) 46 are provided to diagrammatically illustrate coupling of the conductive interconnects 48 and 50 along an overlapping conductive path, and coupling of the conductive interconnects 52 and 54 along an overlapping conductive path.

It is desired to develop architectures suitable for achieving the coupling between the overlapping conductive paths of FIG. 9 while avoiding the problems described above with reference to the prior art of the Background section. Example architectures are described with reference to the remaining figures (FIGS. 10-14). The architectures may be suitable for coupling sense/access lines of multiple memory decks to achieve overlapping conductive paths, and/or may be suitable for other applications in which it is desired to achieve overlapping conductive paths.

Figure 10:
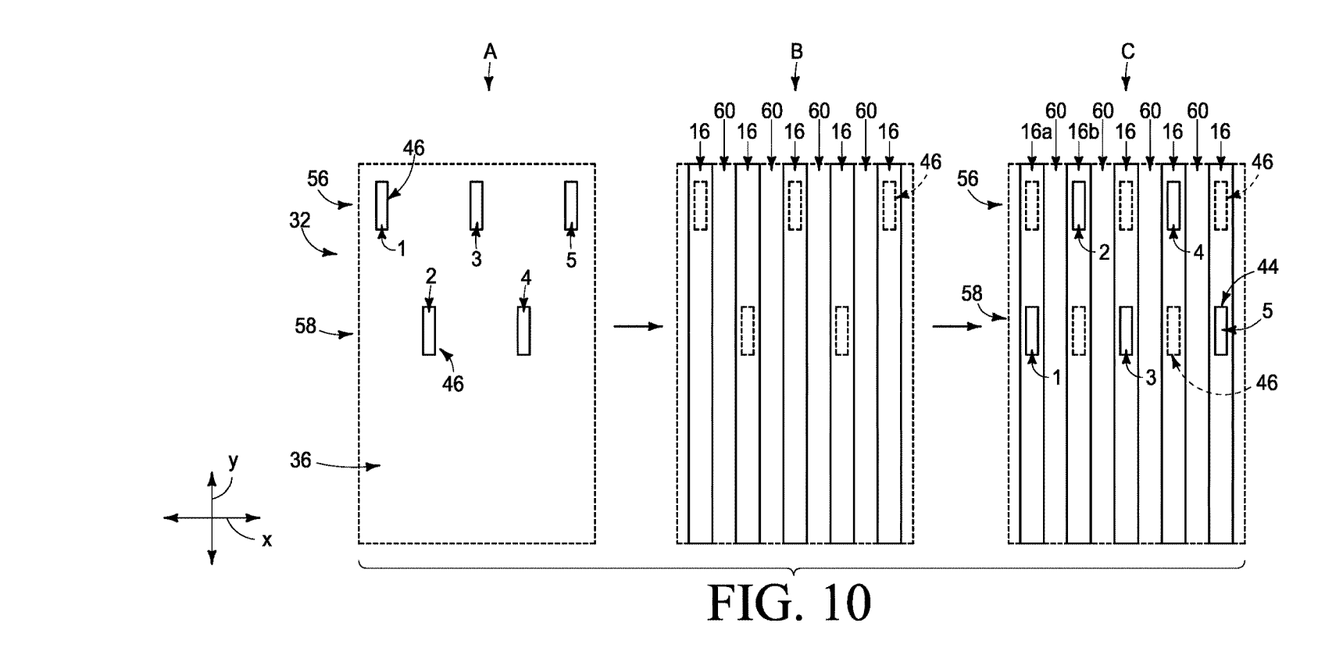
FIG. 10 shows diagrammatic top views of an integrated assembly at sequential process stages of a process sequence.

Referring to FIG. 10, a portion of the base 32 is illustrated at a process stage A. The portion comprises the circuitry region 36. The conductive interconnects 46 are shown to be distributed across the region 36. The conductive interconnects 46 are arranged in a pair of rows 56 and 58, with such rows extending along an illustrated direction of an x-axis. The rows 56 and 58 may be referred to as a first row and a second row, respectively. The first and second rows 56 and 58 are offset from one another along an illustrated y-axis direction. In some embodiments, one of the x-axis and y-axis directions may be referred to as a first direction and the other may be referred to as a second direction.

The conductive interconnects 46 are numbered consecutively 1 through 5 along the direction of the x-axis. Some of the conductive interconnects 46 are oddly numbered (i.e., are numbered 1, 3 and 5), and some are evenly numbered (i.e., are numbered 2 and 4). The oddly numbered interconnects are within the first row 56 and the evenly numbered interconnects are within the second row 58.

A process stage B of FIG. 10 shows regions of the sense/access lines 16 extending over the interconnects 46. The sense/access lines extend along the y-axis direction, and are spaced from one another by intervening spaces 60. In some embodiments, the sense/access lines 16 may be considered to be generically representative of conductive lines or conductive structures.

A process stage C of FIG. 10 shows the second conductive contacts 44 formed over the conductive lines 16. The second conductive interconnects are numbered consecutively 1 through 5 along the direction of the x-axis. Some of the conductive interconnects 44 are oddly numbered (i.e., are numbered 1, 3 and 5), and some are evenly numbered (i.e., are numbered 2 and 4). In the shown embodiment, the second conductive interconnects 44 are arranged in the pair of rows 56 and 58, with the evenly numbered interconnects 44 being in the first row 56 and the oddly numbered interconnects 44 being in the second row 58.

Figure 11:
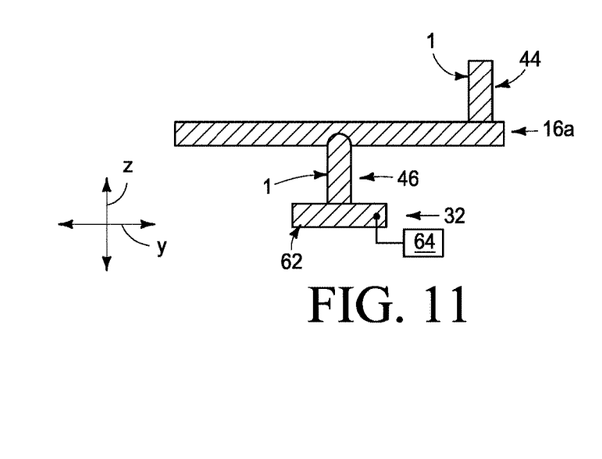
FIGS. 11 and 12 are diagrammatic cross-sectional side views of example integrated assemblies.
Figure 12:
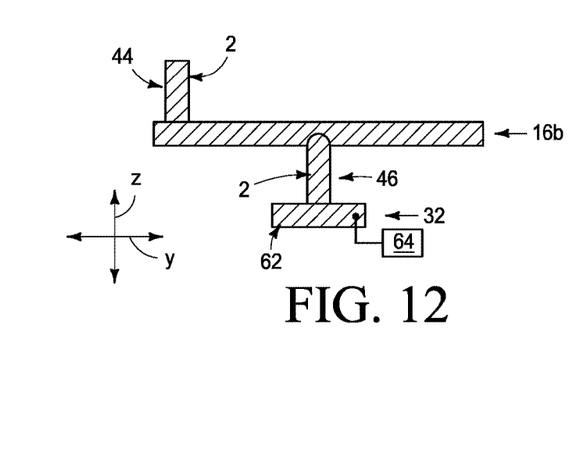

FIGS. 11 and 12 show cross-sectional side views along a pair of the conductive lines 16 at the process stage C of FIG. 10. Specifically, two of the lines 16 at the process stage C are labeled as 16a and 16b, and FIGS. 11 and 12 show cross-sections along the lines 16a and 16b, respectively.

Referring to FIG. 11, the base 32 comprises a conductive structure 62 which is electrically coupled with logic circuitry 64. The circuitry 64 may comprise the decoder circuitries, driver circuitries, sensing circuitries, etc., described above with reference to the circuitries 34 and 36 of FIG. 9.

The interconnect 46 is coupled with the structure 32, and extends upwardly to the conductive line 16a. In the illustrated embodiment, the interconnect 46 penetrates into the conductive line 16a in a manner analogous to that described above with reference to the prior art structure of FIG. 6. However, the upper interconnect 44 is laterally offset relative to the lower interconnect 46 so that any problems associated with a region of the conductive line 16a directly over the conductive interconnect 46 will not adversely impact fabrication of the interconnect 44. Thus, the problems described above in the Background section may be avoided.

The configuration of FIG. 11 has the lower interconnect 46 corresponding to the oddly numbered lower interconnect "1" (from the process stage A of FIG. 10) and has the upper interconnect 44 corresponding to the oddly numbered upper interconnect "1" (from the process stage C of FIG. 10).

FIG. 12 shows a structure similar to that of FIG. 11, but shows the upper interconnect 44 laterally shifted in an opposite direction relative to the lower interconnect 46 as compared to the configuration of FIG. 11. Also, the configuration of FIG. 12 has the lower interconnect 46 corresponding to the evenly numbered lower interconnect "2" (from the process stage A of FIG. 10) and has the upper interconnect 44 corresponding to the evenly numbered upper interconnect "2" (from the process stage C of FIG. 10).

The structures 62, 46, 16 and 44 of FIGS. 11 and 12 may be compositionally the same as one another, or at least one of such structures may be compositionally different relative to at least one other of such structures. In some embodiments, the interconnects 46 may be compositionally different from the conductive lines 16 (i.e., 16a of FIGS. 11 and 16b of FIG. 12). For instance, the conductive interconnects 46 may comprise a different metal and/or metal-containing composition than the conductive lines 16.

The configurations of FIGS. 10-12 pertain to the sense/access lines 16 of FIG. 9. It is to be understood that similar configurations may pertain to the sense/access lines 14 and 28 of FIG. 9.

The configurations of FIGS. 10-12 may be considered to show regions of the sense/access lines 16 which are laterally outward of the memory arrays 30a and 30b of the upper and lower decks 31a and 31b of FIG. 9.

Figure 13:
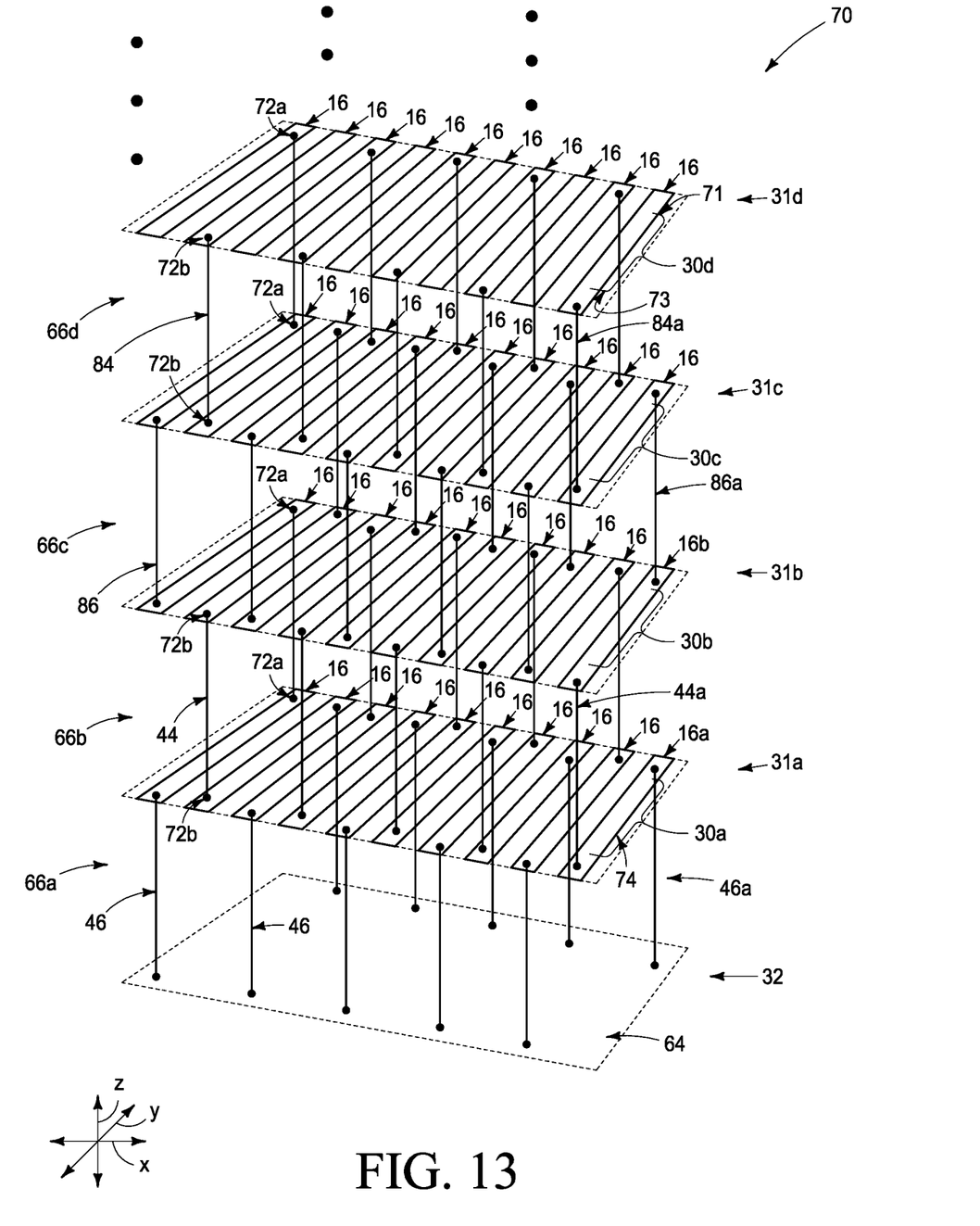
FIG. 13 is a diagrammatic three-dimensional view of an example multideck arrangement.
Figure 14:
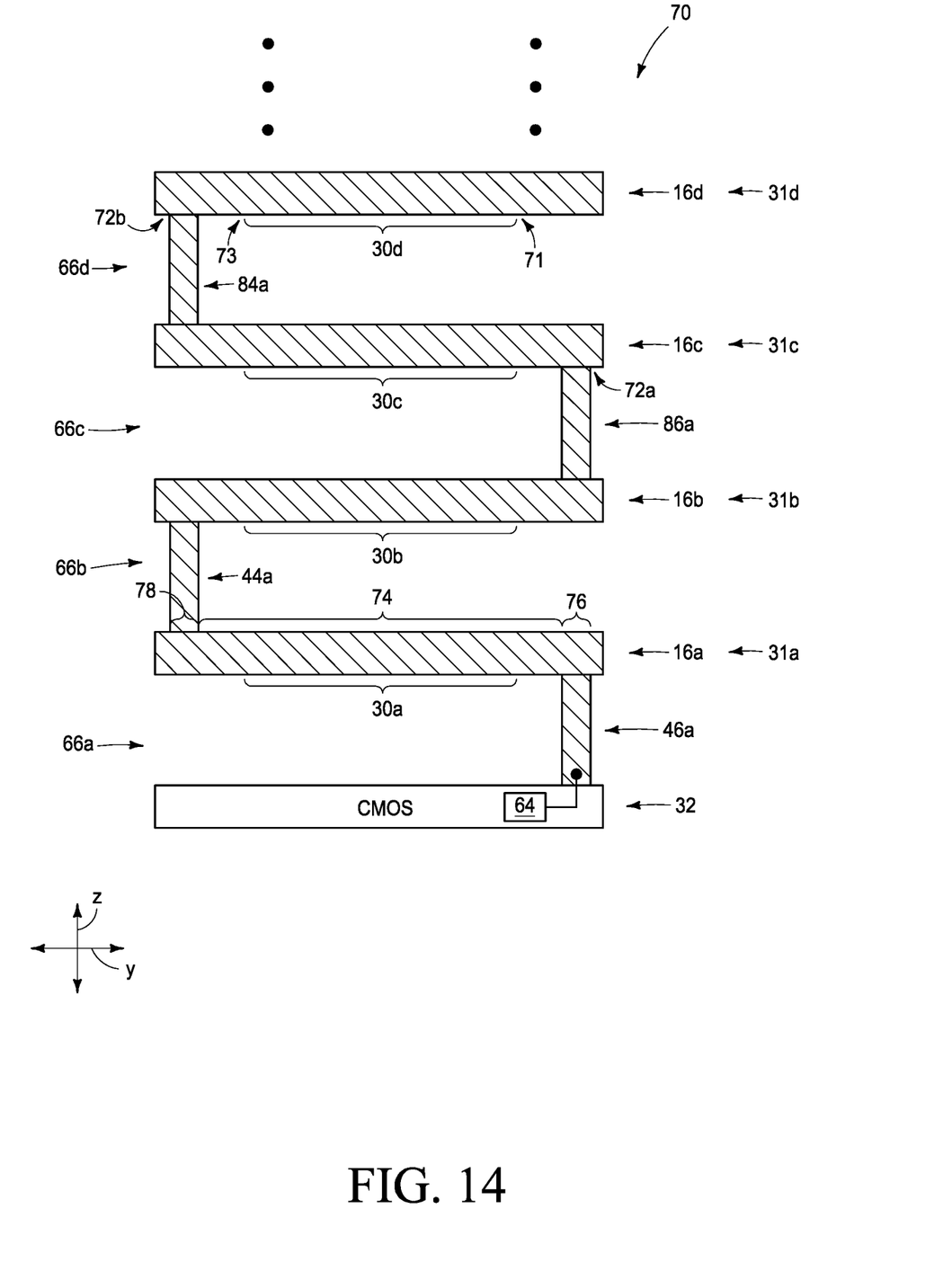
FIG. 14 is a diagrammatic cross-sectional side view of an example multideck arrangement.

FIGS. 13 and 14 show diagrammatic views of an integrated assembly 70 comprising multiple vertically-stacked decks (levels, tiers) 31a-d over a base 32. Only the sense/access lines 16 are shown within the decks 31a-d to simplify the drawing, but it is to be understood that the other sense/access lines 14 and 28 may also be within the decks. Although the integrated assembly is shown comprising at least four decks (actually more than four decks for FIG. 13 as only one set of the sense/access lines (e.g., bitlines 16) are shown, and as the illustrated sense/access line (e.g., bitline) may be shared between two vertically adjacent other sense/access lines (e.g., wordlines 14 and 28 of FIG. 9) so that two memory cell sets are along each of the illustrated sense/access lines 16), it is to be understood that the integrated assembly may extend upwardly beyond the shown region to comprise more than the illustrated decks (as is diagrammatically illustrated with dots provided above the top deck 31d to indicate that more decks may be above the top deck). Alternatively, the integrated assembly may comprise fewer than illustrated decks.

The base 32 comprises the circuitry 64 (e.g., logic circuitry which may include one or more of decoder circuitry, sensing circuitry, wordline driver circuitry, etc.). In some embodiments, the circuitry 64 may be referred to as first circuitry.

The decks 31a-d comprise memory arrays 30a-d, respectively. In some embodiments, each of the memory arrays may be considered to have a first side 71 and an opposing second side 73 (with the sides 71 and 73 being shown relative to the memory array 30d). The sense/access lines 16 may extend laterally outward beyond the first and second sites 71 and 73 of the memory arrays, as shown. Each of the sense/access lines may include a coupling region 72 (only some of which are labeled) which electrically couples the sense/access line with the circuitry 64 of the base 32. In some embodiments, the coupling regions 72 along the first sides 71 of the memory arrays 30 may be referred to as first coupling regions 72a, and the coupling regions 72 along the second sites 73 of the memory arrays 30 may be referred to as second coupling regions 72b.

In some embodiments, the decks 31a, 31b, 31c and 31d may correspond to a first, second, fourth and sixth deck, respectively. In some embodiments, they may correspond to as a first, second, fourth and sixth memory deck, respectively, and may be considered to each comprise memory circuitry. The illustrated conductive lines 16 within the decks 31a, 31b, 31c and 31d may be referred to as first, second, third and fourth conductive lines, respectively; or as first, second, third and fourth conductive structures, respectively.

In the illustrated embodiment, the decks (levels, tiers) 31a-d are vertically spaced from one another by intervening gaps 66b, 66c and 66d, and the base 32 is spaced from the bottom deck 31a by an intervening gap 66a. In some embodiments, the gaps 66 may be considered to alternate between first gaps and second gaps, with the gaps 66a and 66c being representative of the first gaps, and the gaps 66b and 66d being representative of the second gaps.

Conductive interconnects 46 extend upwardly from the base and are electrically coupled with the circuitry 64. Only some of the interconnects 46 are labeled. One of the interconnects 46 is labeled as 46a so that it may be distinguished from the other interconnects. The interconnect 46a may be referred to as a first conductive interconnect. The first conductive interconnect 46a extends between the base 32 and the sense/access line (first conductive line, first conductive structure) 16a of the deck 31a. The first conductive line 16a is coupled with logic circuitry 64 within the base 32 through at least the first conductive interconnect 46a.

A second conductive interconnect 44a extends between the sense/access line 16a of the deck 31a and the sense/access line (second conductive line, second conductive structure) 16b of the deck 31b. The second conductive line 16b within the deck 31b is electrically coupled with the logic circuitry 64 through a conductive path which includes the first and second conductive interconnects 44a and 46a, and a region 74 of the first conductive line 16a. In the illustrated embodiment, the first conductive interconnect 46a is laterally offset from the second conductive interconnect 44a along the illustrated y-axis, and is offset by a distance which includes the entirety of the memory array 30a. In other embodiments, the conductive interconnects 44a and 46a may be laterally offset from one another, but may be on the same side of the memory array 30a as one another.

Referring to FIG. 14, the first conductive structure 16a may be considered to have a first region 76 directly over the conductive interconnect 46a, a second region 78 laterally offset from the first region, and the region 74 as a third region between the first and second regions. The second conductive interconnect 44a extends upwardly from the second region 78 to the second conductive structure 16b. The first conductive structure 16a is electrically coupled to the CMOS circuitry (e.g., the circuitry 64) through a first conductive path which includes at least the first interconnect 46a, and the second conductive structure is electrically coupled to the CMOS circuitry (e.g., the circuitry 64) through a second conductive path which includes at least the second conductive interconnect 44a, the third region 74 of the first conductive structure 16a, and the first conductive interconnect 46a.

The structures 16a-d may be considered to have overlapping conductive paths which extend to the CMOS circuitry (e.g., the circuitry 64) within the base 32, with such conductive paths extending across the gaps 66a-d. The conductive paths may be considered to comprise first interconnects 46a and 86a within the first gaps 66a and 66c, and to comprise second conductive interconnects 44a and 84a within the second gaps 66b and 66d. The first interconnects (i.e., 46a and 86a) are laterally offset relative to the second interconnects 44 (i.e., 44a and 84a).

In some embodiments, the structures 16a, 16b, 16c, 16d, 44a, 46a, 84a and 86a may all be compositionally the same as one another (e.g., may all comprise the same metal, metal-containing compositions, etc.). In other embodiments, at least one of the structures 16a, 16b, 16c, 16d, 44a, 46a, 84a and 86a may be compositionally different from at least one other of the structures 16a, 16b, 16c, 16d, 44a, 46a, 84a and 86a. For instance, in some embodiments the interconnects 44a, 46a, 84a and 86a are compositionally the same as one another, and are compositionally different from the conductive structures 16a-d. For instance, the interconnects 44a, 46a, 84a and 86a may comprise different metals and/or metal-containing compositions relative to the conductive structures 16a-d.

The embodiments described herein may be utilized relative to integrated memory and/or may be utilized relative to other integrated assemblies. Generally, the embodiments may be considered to be broadly applicable to any semiconductor industry application.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a base which includes circuitry. A first conductive interconnect extends upwardly from the base. A first level is over the base and includes a first conductive structure. The first conductive structure is coupled with the circuitry through at least the first conductive interconnect. The first conductive structure has a first region directly over the first conductive interconnect, a second region laterally offset from the first region, and a third region between the first and second regions. A second conductive interconnect extends upwardly from the second region of the first conductive structure. A second level is over the first level and includes a second conductive structure. The second conductive structure is coupled with the circuitry through at least the first conductive interconnect, the third region of the first conductive structure and the second conductive interconnect.

Some embodiments include an integrated assembly having a base which includes logic circuitry. A first deck is over the base. The first deck includes first memory circuitry and a first conductive line associated with the first memory circuitry. A second deck is over the first deck. The second deck includes second memory circuitry and a second conductive line associated with the second memory circuitry. A first conductive interconnect extends between the base and the first deck. The first conductive line is coupled with the logic circuitry through at least the first conductive interconnect. A second conductive interconnect extends between the first deck and the second deck. The second conductive line is coupled with the logic circuitry through a path which includes the first and second conductive interconnects, and a region of the first conductive line. The first conductive interconnect is laterally offset from the second conductive interconnect.

Some embodiments include an integrated assembly having a base which includes first circuitry. Memory decks are over the base. Each of the memory decks has a sense/access line coupled with the first circuitry. The memory decks are vertically spaced from one another by gaps. The gaps alternate in a vertical direction between first gaps and second gaps. A gap between the base and a bottommost of the memory decks is one of the first gaps. Overlapping conductive paths extend from the sense/access lines to the first circuitry. The conductive paths include first conductive interconnects within the first gaps and second conductive interconnects within the second gaps. The first and second conductive interconnects are laterally offset relative to one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
 a base comprising circuitry;
 a first memory level over the base and comprising a first conductive structure, the first conductive structure comprising a first region laterally spaced from a second region;

a first conductive interconnect coupling the first region of the first conductive structure and with the circuitry;

a second conductive interconnect extending upwardly from the second region of the first conductive structure; and a second memory level over the first memory level and comprising a second conductive structure coupled with the circuitry through at least the first and second conductive interconnects and the first conductive structure.

2. The integrated assembly of claim 1 further comprising:

a third conductive interconnect extending upwardly from the second conductive structure and directly over the first region of the first conductive structure; and a third memory level over the second memory level and comprising a third conductive structure; the third conductive structure being coupled with the circuitry through at least the first, second and third conductive interconnects and the first and second conductive structures.

3. The integrated assembly of claim 1 wherein the first conductive interconnect, the second conductive interconnect, the first conductive structure, and the second conductive structure are all compositionally the same as one another.

4. The integrated assembly of claim 1 wherein at least one of the first conductive interconnect, the second conductive interconnect, the first conductive structure, and the second conductive structure is compositionally different from another of the first conductive interconnect, the second conductive interconnect, the first conductive structure, and the second conductive structure.

5. The integrated assembly of claim 1 wherein the first and second conductive interconnects are compositionally different from the first and second conductive structures.

6. An integrated assembly, comprising:

logic circuitry;

first memory circuitry over the logic circuitry, a first conductive line associated with the first memory circuitry;

second memory circuitry over the first memory circuitry, a second conductive line associated with the second memory circuitry;

a first conductive interconnect coupling the first conductive line with the logic circuitry; and a second conductive interconnect laterally spaced from the first conductive interconnect and coupling the second conductive line with the logic circuitry through a path which includes the first and second conductive interconnects, and a region of the first conductive line.

7. The integrated assembly of claim 6 wherein the first conductive line extends laterally across the first memory circuitry, wherein the first conductive interconnect is outward of a first side of the first memory circuitry, and wherein the second conductive interconnect is outward of an opposing second side of the first memory circuitry.

8. The integrated assembly of claim 6 wherein the first and second conductive lines are first and second sense/access lines, respectively.

9. The integrated assembly of claim 6 wherein the first conductive interconnect projects into the first conductive line and is of a different composition than the first conductive line.

* * * * *